(12) United States Patent
Kawahara et al.

(10) Patent No.: US 7,408,965 B2
(45) Date of Patent: Aug. 5, 2008

(54) SEMICONDUCTOR LASER DIODE WITH EMISSION EFFICIENCY INDEPENDENT OF THICKNESS OF P-TYPE CLADDING LAYER

(75) Inventors: Takahiko Kawahara, Yokohama (JP);
Masato Furukawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/790,280

(22) Filed: Apr. 24, 2007

(65) Prior Publication Data
US 2007/0258498 A1 Nov. 8, 2007

(30) Foreign Application Priority Data
Apr. 28, 2006 (JP) ............................. 2006-125937

(51) Int. Cl.
*H01S 3/04* (2006.01)
*H01S 5/00* (2006.01)
(52) U.S. Cl. .................................. 372/43.01; 372/50.1
(58) Field of Classification Search ............... 372/50.1, 372/43.01, 45.01, 54
See application file for complete search history.

(56) References Cited

U.S. PATENT DOCUMENTS

| | | | |
|---|---|---|---|
| 6,815,786 B2 | 11/2004 | Ogasawara et al. | |
| 6,990,131 B2 | 1/2006 | Iga et al. | |
| 2007/0160105 A1* | 7/2007 | Kawahara | 372/96 |

FOREIGN PATENT DOCUMENTS

| | | |
|---|---|---|
| JP | 05-082891 | 4/1993 |
| JP | 2003-060310 | 2/2003 |

* cited by examiner

*Primary Examiner*—Armando Rodriguez
(74) *Attorney, Agent, or Firm*—Smith, Gambrell & Russell, LLP

(57) ABSTRACT

A semiconductor laser diode (LD) has been disclosed, where the emission efficiency is independent on a thickness of the p-type cladding layer. The LD provides a first semiconductor region made of group III-V compound semiconductor material, a mesa region and a burying region. The burying region, disposed on the first region, buries the mesa region. The mesa region includes an active layer, a cladding layer with a first conduction type, another cladding layer with second conduction type and a contact layer with the second conduction type. The LD of the invention in the contact layer thereof contains aluminum (Al) and indium (In) for group III element, while, arsenic (As) for group V element.

12 Claims, 6 Drawing Sheets

SEMICONDUCTOR LASER DIODE WITH EMISSION EFFICIENCY INDEPENDENT OF THICKNESS OF P-TYPE CLADDING LAYER

BACKGROUND OF THE INVENTION

1. Field of the Invention

The present invention relates to a semiconductor optical device, in particular, the invention relates to a semiconductor light-emitting device.

2. Related Background Art

A Japanese Patent Application published as JP-H05-082891A has disclosed a semiconductor laser diode (hereinafter denoted as LD) with a mesa structure that includes an n-type InGaAsP optical guiding layer, an un-doped InGaAsP active layer, a p-type InP cladding layer and a p-type InGaAsP contact layer. This LD further provides a semi-insulating iron-doped InP burying layer so as to bury the mesa structure in both sides thereof the structure to block the current flowing the burying layer, accordingly, to concentrate the current flowing in the mesa structure. Moreover, the LD provides another semi-insulating layer made of InGaAsP with the band gap energy smaller than that of InP, which is a material of the semiconductor substrate, so as to bury the semi-insulating InP burying layer.

Another Japanese Patent Application published as JP-2003-060310A has a semiconductor light-emitting device where the device has a structure to restrict the out diffusion of p-type dopants to the semi-insulating burying layer. This device includes a mesa structure with a stack of layers each formed on a semiconductor substrate. That is, the mesa structure includes a lower cladding layer with a first conduction type, an active region, and an upper cladding layer with a second conduction type. The device further provides semi-insulating semiconductor regions in both sides of the mesa structure, and this semi-insulating region includes a layer including dopants that accelerates the diffusion of impurities to make the upper cladding layer to be the second conduction type and another layer including other dopants that prevents the diffusion of the impurities. Two dopants in the semiconductor region make this region to be semi-insulating.

These semiconductor devices described above provide the configuration that a layer with high resistivity or a semi-insulating characteristic buries the mesa structure including the active layer and the contact layer. The contact layer of these devices, which is formed on the p-type cladding layer, is a p-type InGaAs or a p-type InGaAsP, and the p-type cladding layer, made of p-type InP, has a thickness of 1.5 µm.

Thinning the p-type cladding layer, which reduces the series resistance of the device, degrades the emission efficiency of the device. On the other hand, to make the p-type cladding layer thick to obtain desired emission efficiency increases the series resistance of the device.

SUMMARY OF THE INVENTION

The present invention is to solve above subjects inconsistent to each other, that is, to provide a semiconductor laser diode showing emission efficiency independent of a thickness of the p-type cladding layer.

A light-emitting device according to the present invention is a type of a semiconductor laser diode (LD) providing a mesa including a plurality of semiconductor layers stacked on the semiconductor substrate and regions to bury the mesa. The mesa includes an active layer, a cladding layer and a contact layer. The cladding layer and the contact layer are opposite side to the substrate with respect to the active layer and have a conduction type also opposite to that of the substrate. When the substrate is an n-type semiconductor substrate, the cladding layer and the contact layer have the p-conduction type and put the active layer with the substrate. In the present invention, the contact layer is one of group III-V compound semiconductor material and contains aluminum (Al) and indium (In) for a group III element and arsenic (As) for a group V element. For example, AlInAs and AlGaInAs are available for the contact layer in the present invention.

Because the contact layer of the present invention contains Al and In for group III elements, the refractive index of the contact layer may be small and may suppress the light generated in the active layer to be biased in the contact layer even a thickness of the cladding layer, which is put between the active layer and the contact layer, is set to be thin. Thus, the reduction of the series resistance of the device, which may be brought by thinning the cladding layer, and the suppression of the degradation of the emission efficiency, which may be brought by the decrease of the refractive index of the contact layer, may be coped with.

The device of the present invention may provide another semiconductor layer between the cladding layer and the contact layer. This semiconductor layer may relax the band discontinuity between the cladding layer and the contact layer. Therefore, the series resistance of the device may be further decreased.

DESCRIPTION OF PREFERRED EMBODIMENTS

Next, preferred embodiments of the present invention will be described as referring to accompanying drawings. In the description of drawings and the specification, the same numerals or symbols will refer to the same elements without overlapping explanations.

Figure 1A:
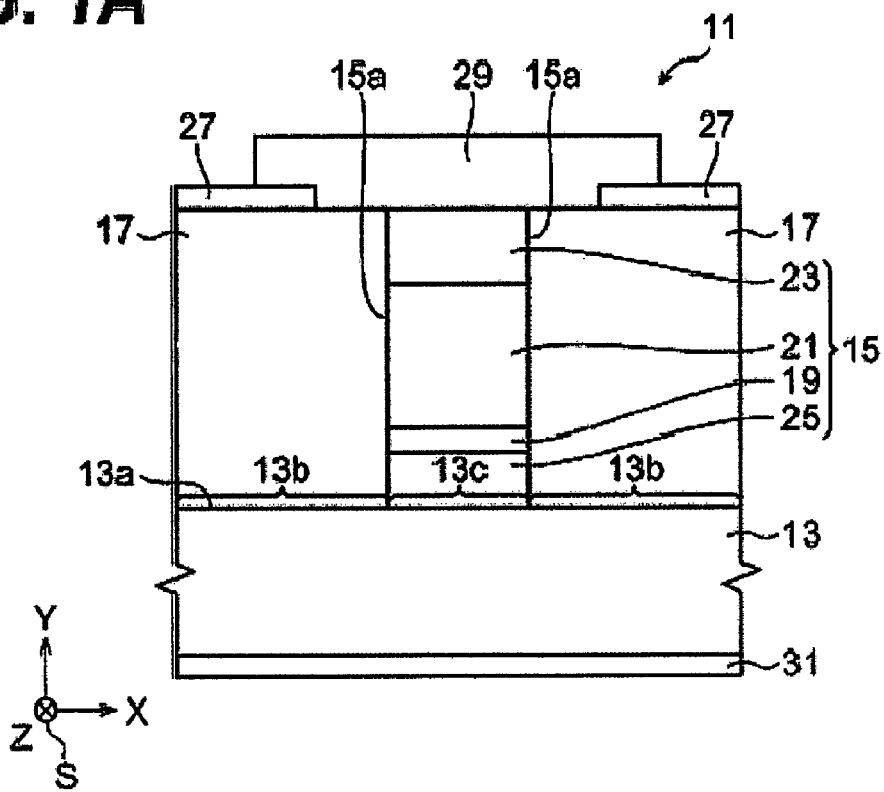
FIG. 1A is a cross section of a semiconductor laser diode according to an embodiment of the present invention.

FIG. 1A is a cross section of a semiconductor optical device 11 according to an embodiment of the invention. The description below concentrates on a semiconductor laser diode as one of the semiconductor light-emitting device. The laser diode 11 includes a semiconductor substrate 13 with a first conduction type, a mesa structure 15 and regions 17 for burying the mesa. The substrate 13 is made of group III-V compound semiconductor material. The mesa 15 and the regions 17 are arranged on the substrate 13. The mesa 15 includes an active layer 19, an upper cladding layer 19 with a second conduction type and a contact layer 23 with the second conduction type. The mesa 15 may include a lower cladding layer 25 with the first conduction type. The upper cladding layer 21 is put between the active layer 19 and the contact layer 23. In the present embodiment, the contact layer 23 contains aluminum (Al) and indium (In) for the group III element, while contains arsenic (As) for the group V element.

Thus, the contact layer 23 of the embodiment includes arsenic as the group V element as well as aluminum and indium for the group III element, this contact layer 23 shows relatively small refractive index compared to that of InGaAs or InGaAsP, they are materials for the contact layer generally used for InP based light-emitting device. This configuration that the contact layer is based on a material including aluminum, indium and arsenic suppresses the light in the active layer to be biased toward the contact layer, which results in the excellent efficiency of the light emission independent on a thickness of the upper cladding layer 21, compared to a device that provides a contact layer made of InGaAs or InGaAsP with a refractive index greater than that of InP.

The substrate 13 with the first conduction type may be an InP substrate, or a GaAs substrate. The substrate 13 in a primary surface 13a thereof may include first and second regions, 13b and 13c, respectively, arranged along the X-direction in the co-ordinate system S shown in FIG. 1A. The second region 13c forms the mesa 15 thereon. On the first region 13b and the side 15a of the mesa 15 provide regions 17. The mesa 15 stacks the active layer 19, the upper cladding layer 21 and the contact layer 23 in the Y-direction. The second region 13c, in other words, the mesa 15 extends along the Z-direction.

The upper cladding layer 21 with the second conduction type forms a hetero-interface with respect to the contact layer 23 also with the second conduction type. The active layer may be a bulked layer, a single quantum well structure, or a multi-quantum well structure. The upper and lower cladding layers, 21 and 25, confines carriers within the active layer 15.

On the mesa 15 and/or on the semiconductor regions 17 are provided with an insulating film 27, which may be made of silicon oxide (SiO) or silicon nitride (SiN). The first electrode 29, for example, the anode electrode of the laser diode 11, comes in contact with the contact layer 23 through an opening provided in the insulating film 27. The present embodiment shown in FIG. 1A provides the upper electrode 29 that covers the whole surface of the contact layer 23. In the back surface of the substrate 13 provides another electrode 31, for example, the cathode electrode of the laser diode.

The following table I shows an exemplary configuration of the laser diode, 11 or 11a:

TABLE I

Exemplary arrangement of device according to the invention

| Layer | Conditions |
| --- | --- |
| substrate 13 | n-type InP |
| lower cladding layer 25 | n-type InP doped with silicon (Si) |
| semiconductor regions 17 | InP doped with iron (Fe) |
| active layer 19 | quantum well of GaInAsP |
| upper cladding layer 21 | p-type InP doped with zinc |
| contact layer 23 | p-type AlInAs doped with carbon (C) |
| insulating layer 27 | silicon dioxide (SiO$_2$) |
| anode electrode 29 | stacked metal of Au/Zn/Ti/Pt/Au |
| cathode electrode 31 | eutectic metal of AuGeNi |

In the configuration above, the contact layer is made of material (AlInAs) with a bandgap wavelength shorter than that of the emission wavelength of the laser diode.

Figure 1B:
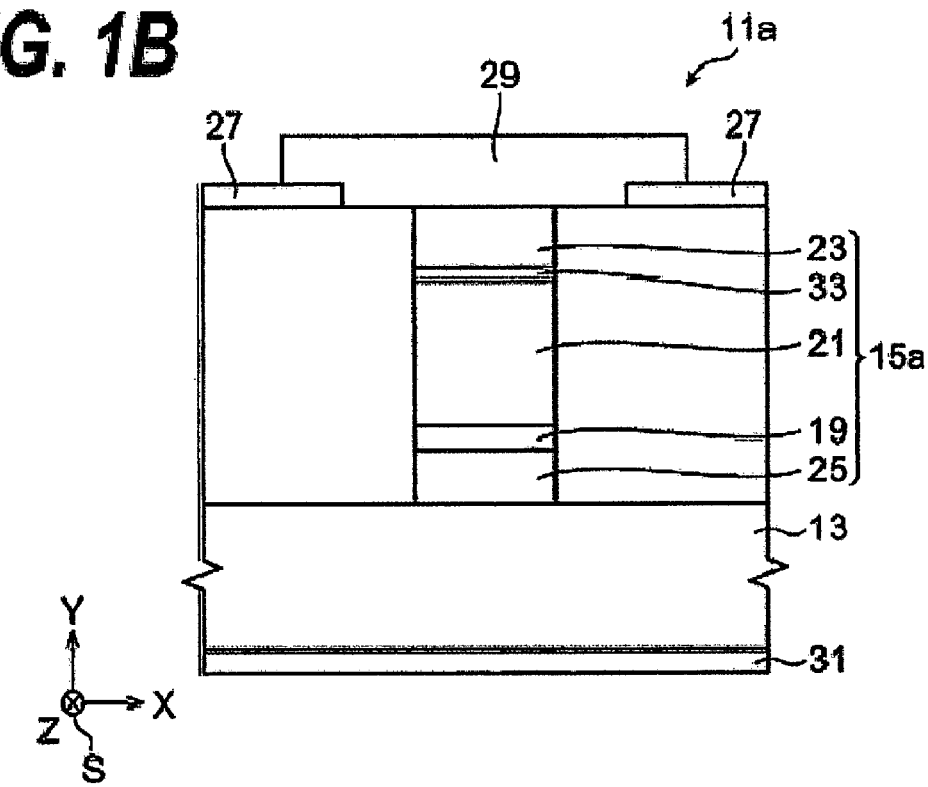
FIG. 1B is a cross section of a laser diode modified from the laser diode shown in FIG. 1A.

FIG. 1B is a cross section of a modified example 11a of the laser diode shown in FIG. 1A. This example 11a provides, in place of the mesa 15 of FIG. 1A, the mesa 15a that includes the active layer 19, the upper cladding layer 21, the contact layer 23, the lower cladding layer 25, and a semiconductor layer 33.

This semiconductor layer 33 is put between the upper cladding layer 21 and the contact layer 23, both having the second conduction type. The layer 33 has a band gap wavelength thereof between those of the upper cladding layer 21 and the contact layer 23. In addition, the hetero-interface between the layer 33 and the upper cladding layer 21 is smaller than the hetero-interface between the upper cladding layer 21 and the contact layer 27, and the hetero-interface between the layer 33 and the contact layer 23 is smaller than that between the upper cladding layer 21 and the contact layer 23. This layer 33 may suppress the increase in the resistance due to the band gap difference between the upper cladding layer 21 and the contact layer 23. When the contact layer is made of AlInAs and the upper cladding layer is InP, the layer 33 made of AlInAsP with the second conduction between the cladding and contact layers, 21 and 23, respectively, may reduce the band discontinuity of the hetero-interface therebetween.

The thickness of the upper cladding layer 21 in the laser diodes, 11 and 11a, may be smaller than 2.5 μm, because the contact layer including aluminum (Al), indium (In) and arsenic (As) does not bias the light generated in the active layer 19 to the contact layer 23. Further, the upper cladding layer 21 may have a thickness greater than 0.5 μm not to absorb the light by carriers injected in the contact layer 23. When the carriers in the contact layer absorb the light in the active layer, the emission efficiency may degrade.

The contact layer 23 may be AlInAs in the laser diodes, 11 and 11a. The AlInAs of the contact layer 23 may be doped with carbon (C) which is one of p-type dopants. The band gap energy of AlInAs is greater than that of InP, while, the refractive index of AlInAs is slightly greater than that of InP. Moreover, AlInAs shows relatively large solubility for carbon, which is around $3 \times 10^{19}$ cm$^{-3}$ and has a characteristic to easily form an ohmic contact with a metal, which is quite effective in particular to the laser diode with a high-mesa structure where the upper surface of the contact layer 23 is forced to be narrow.

In another embodiment, the contact layer 23 may be made of AlGaInAs. Similar to the former case, the band gap energy of AlGaInAs is greater than that of InP and the refractive index of AlGaInAs is slightly larger than that of InP. AlGaInAs may be also doped with carbon, the solubility of which is around $1 \times 10^{19}$ cm$^{-3}$.

Thus, the laser diodes, 11 and 11a, suppress the degradation of the emission efficiency even when the upper cladding layer becomes thin to reduce the series resistance of the device, accordingly, the height of the mesa may be lowered. Moreover, the laser diodes, 11 and 11a, in the contact layer thereof include carbons as the p-type dopant, which may decrease the contact resistance between the p-type contact layer and the ohmic electrode.

The band gap energy of AlInAs is greater than that of InGaAs and the refractive index of AlInAs, n=3.169, is slightly smaller than that of InGaAs, n=3.198, at a wavelength λ=1.55 μm, where n denotes the refractive index. The optical absorption by the AlInAs contact layer is small enough at λ=1.55 μm. Accordingly, the AlInAs may operate as a cladding layer.

An alloyed metal, for instance, AuZn, may be applicable for AlInAs as a good ohmic electrode, which enables to reduce the series resistance of the device. Zinc (Zn) is a popular p-type dopant for group III-V compound semiconductors. The solubility of Zn in AlInAs is about $2 \times 10^{18}$ cm$^{-3}$, while that of carbon (C) in AlInAs exceeds $3 \times 10^9$ cm$^{-3}$, which is a digit larger than that for Zn. Therefore, to use CBr$_4$ as a source material of the doping makes it possible to obtain a good ohmic characteristic to the p-type AlInAs.

Next, a process for manufacturing the laser diode shown in FIGS. 1A and 1B will be described.

First, an n-type InP substrate was set within the OMVPE (Organic Metal Vapor Phase Epitaxy) furnace, where the inner pressure was about 60 Torr. A temperature within the furnace was raised up to 400° C. as hydrogen (H$_2$) flows therein. Phosphine was added to the hydrogen at 400° C. to prevent phosphorous atoms from dissociating from the surface of the InP substrate.

Next, the process sequentially grew an n-type InP buffer layer, a GaInAsP active layer with a thickness of around 300 nm, and a GaInAsP layer for an optical grating at 660° C. to obtain a substrate with epitaxial layers thereon. Subsequently, the process formed a periodic structure with a depth of about 40 nm for the grating in the last grown layer, GaInAsP, by a combination of the interference lithography and the subsequent etching. After the formation of the grating, the substrate with epitaxial layers was set within the growth furnace again and the furnace was raised in the inner temperature thereof up to 550° C. in an atmosphere containing arsine (AsH$_3$) and phosphine (PH$_3$)

The process grew the first p-type InP layer at 550° C. with Zn as the dopant. The carrier concentration of the first p-type InP layer was $5 \times 10^{17}$ cm$^{-3}$, and a thickness thereof was 100 nm. The temperature within the furnace was raised up to 660° C. as supplying the phosphine only. The second p-type InP layer was grown at 660° C. with Zn as the dopant. The carrier concentration and the thickness of the second p-type InP layer were $5 \times 10^{17}$ cm$^{-3}$ and 400 nm, respectively.

The third p-type InP layer was grown at 660° C. with Zn as the dopant. The carrier concentration and the thickness of the third p-type InP layer were $1 \times 10^{18}$ cm$^{-3}$ and 1000 nm, respectively. After the growth of the third p-type InP layer, the process fell the furnace temperature down to 550° C. The p-type AlInAsP layer was grown at 550° C. with Zn as the dopant. This AlInAsP layer moderated the hetero-interface, and had the carrier concentration and the thickness thereof were $2 \times 10^{18}$ cm$^{-3}$ and 100 nm, respectively. Finally, the p-type AlInAs layer was grown by CBr$_4$ as the source material for the carbon doping. The carrier concentration and the thickness of the AlInAs layer were $2 \times 10^{19}$ cm$^{-3}$ and 400 nm, respectively.

After the growth of epitaxial layers, the process formed a mask with a strip shape, a width of which was 1.5 µm, and made of silicon dioxide (SiO$_2$). The mesa with a height of 2.5 µm was formed by the reactive ion etching (RIE) using hydrochloric acid with nitrogen as a reactive gaseous. A wet-etching using a mixed solution of hydrochloric acid, acetic acid and hydrogen peroxide was preferably to be carried out with the dry-etching to remove converted layers caused by the dry-etching.

The substrate thus processed by the etching was set within the furnace again. The process grew the regions of InP doped with iron (Fe), which showed quite high resistivity, to bury the mesa structure. After removing the mask with stripe shape by fluoric acid, another silicon dioxide (SiO$_2$) layer was formed on the substrate by the thermal CVD technique.

After etching a portion of the SiO$_2$ layer to form a window, a stacked metal of Au/Zn/Ti/Pt/Au was evaporated thereon. This stacked metal, became a p-type electrode of the laser diode, was patterned. On the other hand, the back surface of the substrate was evaporated with another metal of AuGeNi, which became the cathode electrode of the laser diode, after thinning the substrate to about 100 µm and removing the damaged layer caused by the thinning. Evaporated metals on the top and bottom surfaces were alloyed to show the non-rectifying characteristic. The scribing and the cleaving of the substrate so as to form the cavity length to be 300 µm completed the laser diode that emits light with a wavelength in 1.55 µm band.

For the conventional structure of the laser diode, the process grew a GaInAsP layer, instead of the AlInAsP layer, to moderate the hetero-interface, and an InGaAs contact layer instead of the AlInAs layer. Other processes and their conditions followed the process described above.

Figure 2:
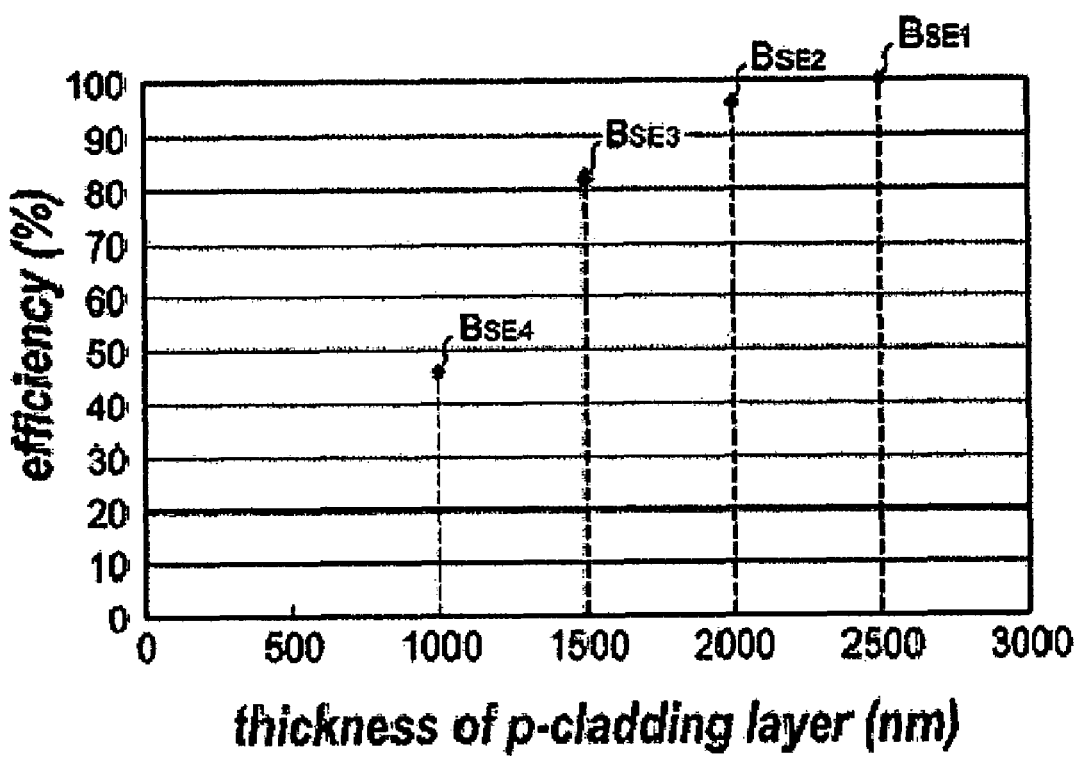
FIG. 2 shows a relation of the emission efficiency to thicknesses of the p-type cladding layer for a conventional laser diode.
Figure 3:
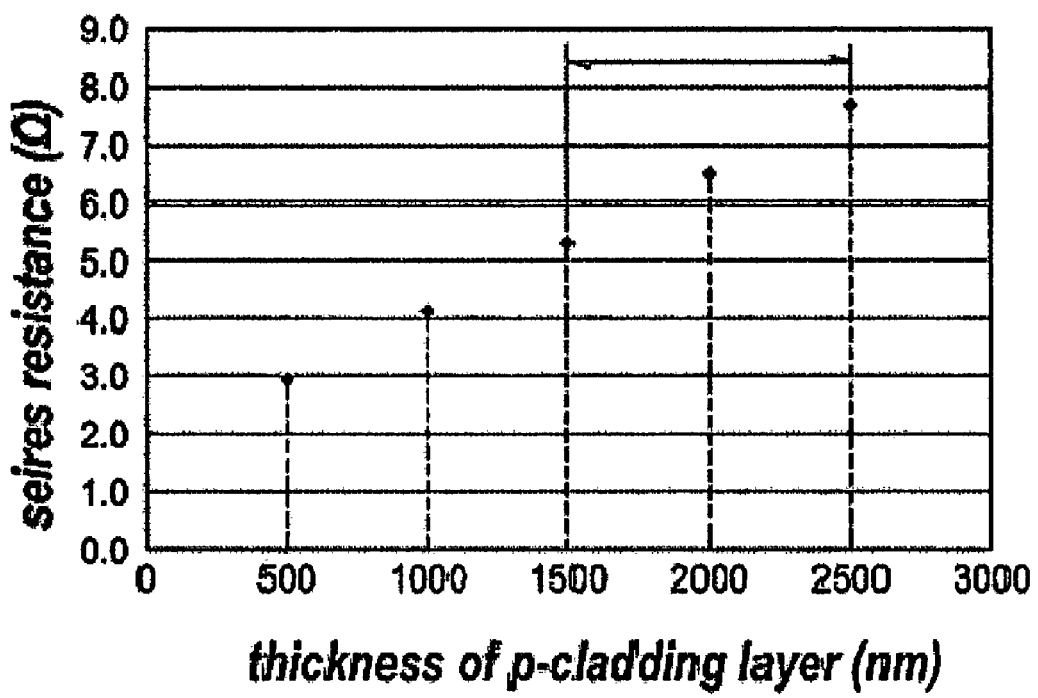
FIG. 3 shows a relation of the series resistance to thicknesses of the p-type cladding layer for a conventional laser diode.

Next, various characteristics of the laser diode according to the present invention will be compared to those of the conventional diode. FIG. 2 shows a relation between the thickness of the p-type cladding layer and the emission efficiency of the laser diode for the conventional diode. FIG. 3 shows a relation between the thickness of the p-type cladding layer and the series resistance of the device with the conventional configuration.

Because the InGaAs contact layer of the conventional diode shows the larger refractive index relative to that of the active layer, the contact layer may operate as a waveguide layer, thus, the contact layer biases the optical density thereto. Thus, the reduction of the emission efficiency shown in FIG. 2 is caused by the optical absorption in the InGaAs contact layer. For instance, inner losses of the laser diode due to the optical absorption of the p-type cladding layer are calculated to be 97.7/cm, 17.7/cm and 15.1/cm for the thicknesses, 0.5 µm, 1.5 µm and 2.5 µm, respectively, of the p-type cladding layer. As shown in FIG. 2, the absorption in the contact layer becomes negligible when the thickness of the p-type cladding layer is 2.5 µm. FIG. 2 assumes that the emission efficiency is 100% when the thickness of the p-type cladding layer becomes 2.5 µm.

The efficiency of the diode rapidly degrades as the thickness of the p-type cladding layer becomes thin as shown in points from BSE1 to BSE4 in FIG. 2. Referring to FIGS. 2 and 3, it is apparent that thinning the p-type cladding layer to decrease the series resistance of the diode results in the degradation of the emission efficiency. Thus, in the conventional layer configuration, the thickness of the p-type cladding layer is necessary to be at least 2.5 µm.

Figure 4:
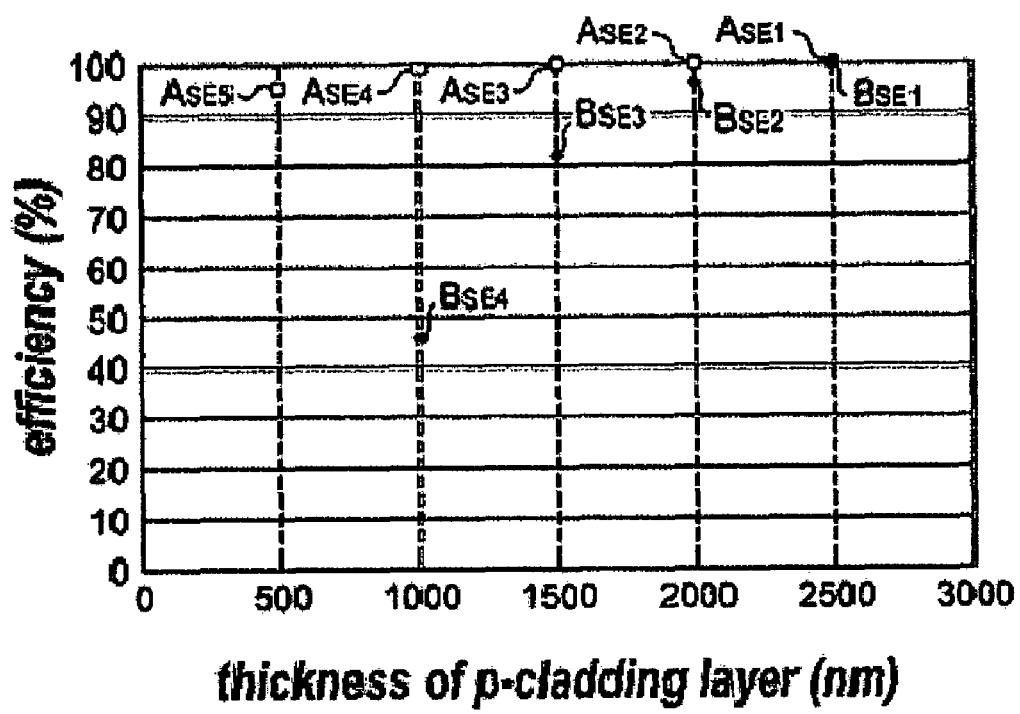
FIG. 4 shows a relation of the emission efficiency to thicknesses of the p-type cladding layer of a laser diode according to the present invention.
Figure 5:
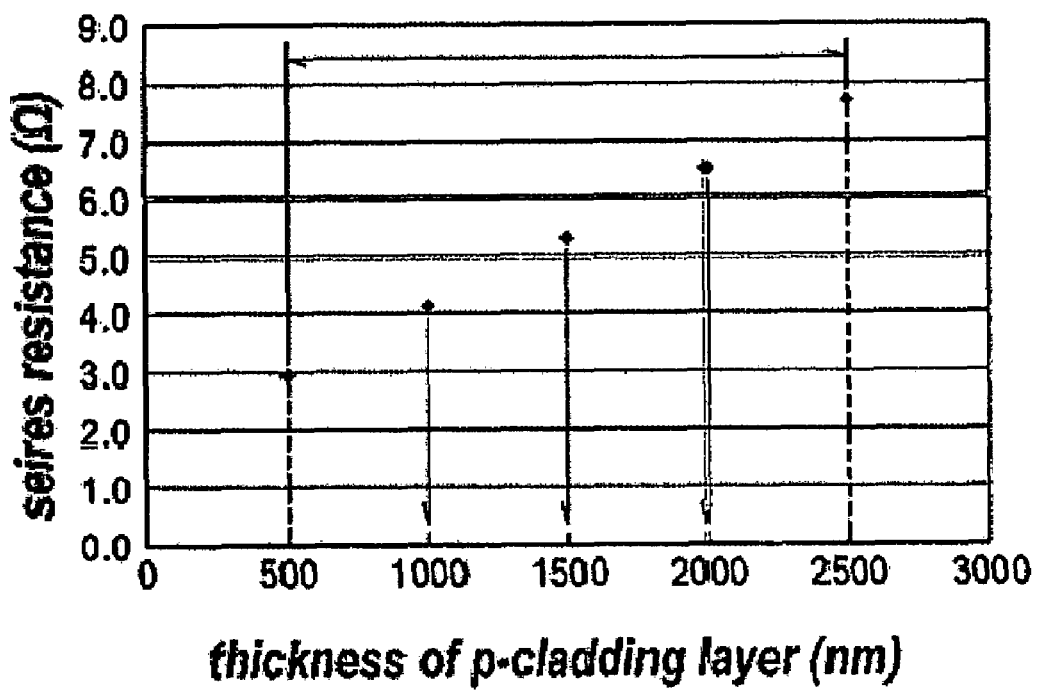
FIG. 5 shows a relation of the series resistance to thicknesses of the p-type cladding layer of a laser diode according to the present invention.

FIG. 4 shows a relation between the thickness of the p-type cladding layer and the emission efficiency of the laser diode according to the embodiment shown in FIG. 1A, while, FIG. 5 shows a relation of the series resistance of the diode to the thickness of the p-type cladding layer of the present invention. The laser diode of the present invention, even the thickness of the p-type cladding layer becomes thin, which corresponds to points from ASE1 to ASE5 in FIG. 4, slightly degrades the emission efficiency, which is about 95% even when the thickness of the p-type cladding layer becomes 0.5 µm. Thus, the p-type cladding layer with a thickness thereof over 0.5 µm up to 2.5 µm may be applicable.

The inner loss for the device with thicknesses of the p-type cladding layer of 0.5 µm, 1.5 µm and 2.5 µm may be estimated to be 17.5/cm, 15.1/cm and 15.0/cm, respectively. Accordingly, comparing to the conventional laser diode with the same thickness of the p-type cladding layer, the inner loss of the present laser diode appears to be always small when the thickness of the p-type cladding layer is thinner than 2.5 µm, in other words, the emission efficiency of the present laser diode becomes superior to the conventional diode in a region where the thickness of the p-type cladding layer is thinner than 2.5 µm, and accordingly, the series resistance of the device may be reduced.

Figure 6A:
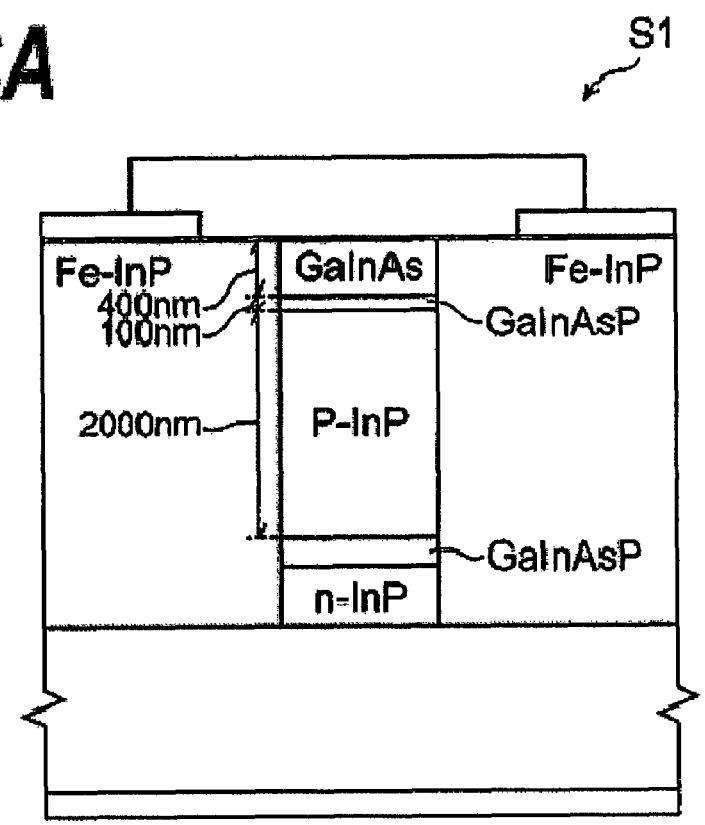
FIG. 6A is a cross section of a DFB laser diode for a conventional structure.
Figure 6B:
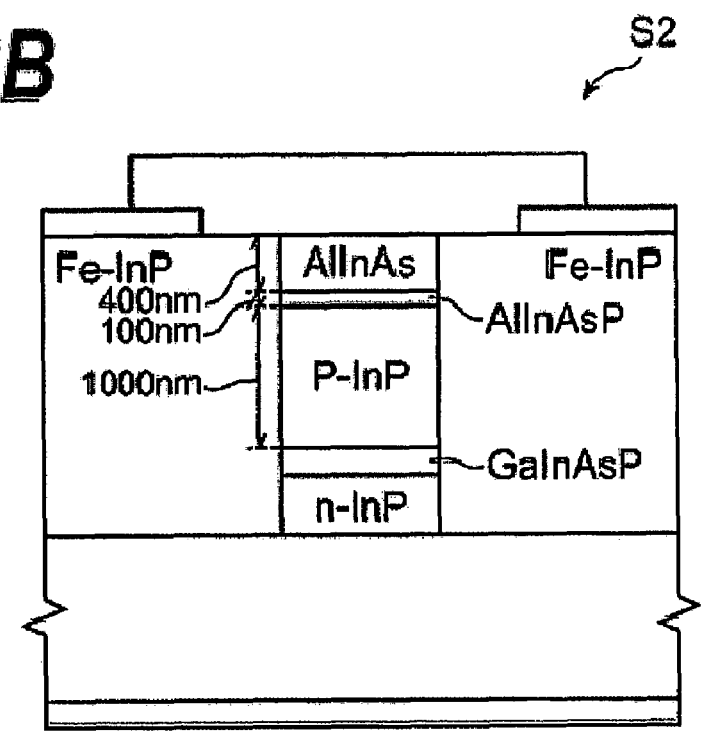
FIG. 6B is a cores section of a DFB laser diode according to the present invention.

Specifically, a conventional laser diode with a contact layer made of InGaAs and a p-type cladding layer with a thickness of 1.5 µm, which is a type of Fabty-Perot laser diode, shows the emission efficiency of 0.17 W/A and the series resistance of 5.3 Ω. FIGS. 6A and 6B show laser diodes, S1 and S2, each having the distributed feedback (DFB) structure of the conventional layer structure and a structure according to the present invention, respectively. The conventional DFB laser diode S1, which has the GaInAs contact layer and the p-type InP cladding layer with the thickness of 2.0 μm shows the emission efficiency of 0.20 W/A and the series resistance of 6.5 Ω, while, the laser diode S2 according to the invention with the AlInAs contact layer and the p-type cladding layer with thickness of 1.0 μm shows the emission efficiency of 0.21 W/A at the series resistance of 4.3 Ω, which may realize the emission efficiency consistent with the series resistance.

While the invention has been illustrated and described as embodied in a laser diode, it is not intended to be limited to the details shown, since various modifications and structural changes may be made without departing in any way from the spirit of the present invention. For example, the description concentrates on a semiconductor optical device such as laser diode, an optical device may integrate an optical modulator with a light-emitting device. Therefore, it is contemplated to cover the present invention, any and all modifications, variations, or equivalents that fall within the true spirit and scope of the basic underlying principles disclosed and claimed herein.

What is claimed is:

1. A light-emitting device, comprising:
    a semiconductor substrate with a first conduction type;
    a mesa provided on the semiconductor substrate, the mesa including an active layer, a cladding layer with a second conduction type opposite to the first conduction type and a contact layer with the second conduction type, the active layer and the contact layer putting the cladding layer therebetween;
    a region, provided on the semiconductor substrate, for burying the mesa; and
    a semiconductor layer put between the cladding layer and the contact layer,
    wherein the cladding layer with the second conduction type is made of group III-V compound semiconductor material constituting aluminum (Al) and indium (In) for group III elements and arsenic (As) for a group V element, and
    wherein the semiconductor layer has a band gap wavelength shorter than a band gap wavelength of the cladding layer and longer than a band gap wavelength of the contact layer.
2. The light-emitting device according to claim 1,
    wherein the semiconductor layer forms a hetero-interface to the cladding layer and to the contact layer, a height of the hetero-interface to the cladding layer being smaller than a height of the hetero-interface to the contact layer.
3. The light-emitting device according to claim 1,
    wherein the semiconductor layer is p-type AlInAsP, the cladding layer is p-type InP, and the contact layer is p-type AlInAs.
4. The light-emitting device according to claim 3,
    wherein the semiconductor layer is p-type AlInAsP doped with zinc (Zn) and has a carrier concentration of $2 \times 10^{18}$ cm$^{-3}$.
5. The light-emitting device according to claim 1,
    wherein the second conduction type is p-type, and
    wherein the contact layer is made of semiconductor material chosen from a p-type AlGaInAs doped with carbon (C) or a p-type AlInAs doped with carbon (C).
6. The light-emitting device according to claim 5,
    wherein the cladding layer has a thickness thinner than 2.5 μm and thicker than 0.5 μm.
7. The light-emitting device according to claim 5,
    wherein the cladding layer is p-type InP.
8. A semiconductor light-emitting device, comprising:
    a semiconductor substrate with a first conduction type;
    a mesa provided on the semiconductor substrate, the mesa including an active layer, a cladding layer with a second conduction type opposite to the first conduction type and a contact layer with the second conduction type, the active layer and the contact layer putting the cladding layer therebetween; and
    a region, provided on the semiconductor substrate, for burying the mesa,
    wherein the cladding layer with the second conduction type is made of group III-V compound semiconductor material constituting aluminum (Al) and indium (In) for group III elements and arsenic (As) for a group V element,
    wherein the second conduction type is p-type, and wherein the contact layer is made of semiconductor material chosen from a p-type AlGaInAs doped with carbon (C) or a p-type AlInAs doped with carbon (C).
9. The light-emitting device according to claim 8,
    wherein the cladding layer with the second conduction type has a thickness smaller than 2.5 pm.
10. The light-emitting device according to claim 8,
    wherein the contact layer has a carrier concentration of $2 \times 10^{19}$ cm$^{-3}$ and a thickness of 400 nm.
11. The light-emitting device according to claim 9,
    wherein the cladding layer has a thickness greater than 0.5 pm.
12. The light-emitting device according to claim 11,
    wherein the cladding layer is p-type InP with a thickness of 1 μm and has a carrier concentration of $1 \times 10^{18}$ cm$^{-3}$.

* * * * *